United States Patent
Patil et al.

(10) Patent No.: US 9,043,665 B2
(45) Date of Patent: *May 26, 2015

(54) FUNCTIONAL FABRIC BASED TEST WRAPPER FOR CIRCUIT TESTING OF IP BLOCKS

(75) Inventors: Srinivas Patil, Austin, TX (US); Abhijit Jas, Austin, TX (US); Peter Lisherness, Goleta, CA (US)

(73) Assignee: Intel Corporation, Santa Clara, CA (US)

( * ) Notice: Subject to any disclaimer, the term of this patent is extended or adjusted under 35 U.S.C. 154(b) by 588 days.

This patent is subject to a terminal disclaimer.

(21) Appl. No.: 13/044,285

(22) Filed: Mar. 9, 2011

(65) Prior Publication Data

US 2012/0233514 A1 Sep. 13, 2012

(51) Int. Cl.
  *G01R 31/28* (2006.01)
  *G01R 31/3185* (2006.01)
  *G06F 11/267* (2006.01)

(52) U.S. Cl.
  CPC *G01R 31/318508* (2013.01); *G01R 31/318561* (2013.01); *G06F 11/267* (2013.01)

(58) Field of Classification Search
  USPC ............................................. 714/734, E11.02
  See application file for complete search history.

(56) References Cited

U.S. PATENT DOCUMENTS

| | | | |
|---|---|---|---|
| 6,643,810 B2 | 11/2003 | Whetsel | |
| 7,080,299 B2 | 7/2006 | McLaurin | |
| 7,162,670 B2 | 1/2007 | Smith | |
| 7,269,805 B1 | 9/2007 | Ansari et al. | |

(Continued)

FOREIGN PATENT DOCUMENTS

| CN | 1734278 A | 2/2006 |
|---|---|---|
| CN | 1910571 A | 2/2007 |

(Continued)

OTHER PUBLICATIONS

Author: Wei Li, Zbigniew Dziong and Y.T. Wang; Title: Architecture and Performance of a Multi-Tbps Protocol Independent Switching Fabric; Publisher: IEEE, 0-7803-6711-1/01; Date: 2001.*

(Continued)

*Primary Examiner* — April Y Blair
*Assistant Examiner* — Thien D Nguyen
(74) *Attorney, Agent, or Firm* — Law Office of R. Alan Burnett, PS (57) ABSTRACT

A Test Wrapper and associated Test Access Mechanism (TAM) architecture for facilitating testing of IP blocks integrated on a System on a Chip (SoC). The TAM architecture includes a Test Controller and one or more Test Wrappers that are integrated on the SoC proximate to IP blocks. Test data and commands corresponding to input from an external tester are packaged by the Test Controller and sent to one or more Test Wrappers via an interconnect fabric. The Test Wrappers interface with one or more IP test ports to provide test data, control, and/or stimulus signals to the IP blocks to facilitate circuit-level testing of the IP blocks. Test results for the circuit-level tests are returned to the Test Controller via the fabric. Test Wrappers may be configured to pass through interconnect signals, enabling functional testing of IP blocks to be facilitated via test packages and test results transmitted between the Test Controller and the IP blocks via the fabric. Test wrappers may also be configured to test multiple IP blocks comprising a test partition.

24 Claims, 5 Drawing Sheets

(56) References Cited

U.S. PATENT DOCUMENTS

| | | | |
|---|---|---|---|
| 7,290,186 B1* | 10/2007 | Zorian et al. | 714/718 |
| 7,353,362 B2 | 4/2008 | Georgiou et al. | |
| 7,519,884 B2 | 4/2009 | Whetsel | |
| 7,568,141 B2 | 7/2009 | Menon et al. | |
| 7,577,540 B2 | 8/2009 | Wang et al. | |
| 7,590,902 B1 | 9/2009 | Tabatabaei et al. | |
| 7,607,057 B2 | 10/2009 | Boike et al. | |
| 7,624,320 B2 | 11/2009 | Yi et al. | |
| 7,761,763 B2 | 7/2010 | Shin et al. | |
| 7,861,027 B2 | 12/2010 | Shoemaker et al. | |
| 8,438,440 B2* | 5/2013 | Whetsel | 714/727 |
| 8,479,129 B1 | 7/2013 | Kalyanaraman et al. | |
| 8,522,189 B2 | 8/2013 | Patil et al. | |
| 2002/0184419 A1* | 12/2002 | Creedon et al. | 710/100 |
| 2003/0046622 A1* | 3/2003 | Whetsel | 714/724 |
| 2003/0120986 A1* | 6/2003 | Whetsel | 714/724 |
| 2003/0167144 A1 | 9/2003 | Wang et al. | |
| 2004/0019891 A1* | 1/2004 | Koenen | 718/102 |
| 2004/0078709 A1 | 4/2004 | Beukema et al. | |
| 2004/0081171 A1* | 4/2004 | Finn | 370/395.53 |
| 2004/0128641 A1* | 7/2004 | Broberg et al. | 716/18 |
| 2004/0153915 A1* | 8/2004 | McLaurin | 714/724 |
| 2004/0212393 A1* | 10/2004 | Abramovici et al. | 326/38 |
| 2005/0030971 A1* | 2/2005 | Yuan | 370/462 |
| 2006/0031807 A1* | 2/2006 | Abramovici | 716/17 |
| 2007/0101195 A1* | 5/2007 | Gooch et al. | 714/34 |
| 2007/0106923 A1* | 5/2007 | Aitken et al. | 714/718 |
| 2007/0113123 A1 | 5/2007 | Crouch et al. | |
| 2007/0208971 A1* | 9/2007 | Goel | 714/724 |
| 2007/0255986 A1 | 11/2007 | Chang et al. | |
| 2008/0022172 A1* | 1/2008 | Yi et al. | 714/726 |
| 2008/0034334 A1 | 2/2008 | Laouamri et al. | |
| 2008/0263486 A1 | 10/2008 | Alexanian et al. | |
| 2008/0290878 A1 | 11/2008 | Waayers | |
| 2008/0313515 A1 | 12/2008 | Shin et al. | |
| 2009/0089467 A1* | 4/2009 | Rothman et al. | 710/107 |
| 2009/0164845 A1 | 6/2009 | Whetsel | |
| 2009/0183040 A1* | 7/2009 | Whetsel | 714/727 |
| 2009/0235222 A1* | 9/2009 | Raje et al. | 716/16 |
| 2010/0023807 A1* | 1/2010 | Wu et al. | 714/30 |
| 2010/0278195 A1* | 11/2010 | Wagh et al. | 370/476 |
| 2011/0078356 A1 | 3/2011 | Shoemaker et al. | |
| 2011/0175638 A1* | 7/2011 | Maeda | 324/762.01 |
| 2011/0307750 A1* | 12/2011 | Narayanan et al. | 714/729 |
| 2012/0159251 A1* | 6/2012 | Wu et al. | 714/30 |
| 2012/0191400 A1* | 7/2012 | Sontakke et al. | 702/119 |
| 2012/0232825 A1 | 9/2012 | Patil et al. | |
| 2012/0233504 A1 | 9/2012 | Patil et al. | |
| 2013/0024737 A1* | 1/2013 | Marinissen et al. | 714/727 |
| 2013/0073917 A1* | 3/2013 | Whetsel | 714/727 |
| 2013/0268808 A1 | 10/2013 | Patil et al. | |

FOREIGN PATENT DOCUMENTS

| | | |
|---|---|---|
| CN | 101297208 A | 10/2008 |
| CN | 100492039 C | 5/2009 |
| CN | 100575976 C | 12/2009 |
| CN | 101620585 A | 1/2010 |
| CN | 101788644 A | 7/2010 |
| CN | 101923133 A | 12/2010 |
| CN | 101788644 B | 11/2011 |
| CN | 101923133 B | 11/2012 |
| WO | 2012/121780 A2 | 9/2012 |
| WO | 2012/121781 A1 | 9/2012 |
| WO | 2012/121783 A2 | 9/2012 |

OTHER PUBLICATIONS

International Search Report & Written Opinion received for PCT Patent Application No. PCT/US2011/066644, mailed on Sep. 12, 2012, 11 pages.

International Search Report & Written Opinion received for PCT Patent Application No. PCT/US2011/066625, mailed on Aug. 14, 2012, 9 pages.

International Search Report & Written Opinion received for PCT Patent Application No. PCT/US2011/066600, mailed on Sep. 12, 2012, 10 pages.

International Preliminary Report on Patentability / with Written Opinion received for PCT Patent Application No. PCT/US2011/066600 mailed on Sep. 19, 2013.

International Preliminary Report on Patentability / with Written Opinion received for PCT Patent Application No. PCT/US2011/066625 mailed on Sep. 19, 2013.

International Preliminary Report on Patentability received for Patent Application No. PCT/US2011/066644, mailed on Sep. 19, 2013.

DaSilva F., "Overview of the IEEE P1500 Standard", ITC International Test Conference, 2003, 10 Pages.

Extended Search Report received for European Patent Application No. 11860143.4, mailed on Jul. 16, 2014, 9 pages.

Office Action received for Korean Patent Application No. 2013-7025678, mailed on Aug. 22, 2014, 9 pages of Office Action including 3 pages Of English Translation.

Kalyanaraman, et al., "Diagnosis of Complex Design/Architechture Problems Using BFMs With Advanced Delay Modeling," U.S. Appl. No. 61/347,131, filed May 21, 2010, 30 pages.

European Search Report received for PCT Patent Application No. PCT/US2011/066600, mailed Jul. 16, 2014, 9 pages.

Office Action for Korean Patent Application No. 10-2013-7025147, mailed on Oct. 27, 2014, 2 pages of English Translation and 3 pages of Korean Office Action.

Office Action for Chinese Patent Application No. 201180069115.0, mailed on Nov. 27, 2014, 6 pages of English Translation and 5 pages of Chinese Office Action.

Office Action for Chinese Patent Application No. 201180069866.2, mailed on Jan. 28, 2015, 25 pages of English Translation and 19 pages of Chinese Office Action.

Notice of Allowance received for Korean Patent Application No. 2013-7025678, mailed on Feb. 23, 2015, 1 page of English Translation and 3 pages of Korean Notice of Allowance.

* cited by examiner

FUNCTIONAL FABRIC BASED TEST WRAPPER FOR CIRCUIT TESTING OF IP BLOCKS

FIELD OF THE INVENTION

The field of invention relates generally to computer systems and, more specifically but not exclusively relates to testing System on a Chip (SoC) designs.

BACKGROUND INFORMATION

Computer architectures are moving from interfacing discrete components on a printed circuit board or through use of other package configurations, to integrating multiple components onto a single integrated chip, which is commonly referred to as a System on a Chip (SoC) architecture. SoCs offer a number of advantages, including denser packaging, higher speed communication between functional components, and lower temperature operation. SoC designs also provide standardization, scalability, modularization, and reusability.

While SoC architectures are the wave of the future, they present some challenges with respect to verification of design and integration when compared with using discrete components. For example, for many years personal computers employed INTEL's ubiquitous "North" bridge and "South" bridge architecture, wherein a central processing unit was interfaced to a memory controller hub (MCH) chip via a first set of buses, and the memory controller hub, in turn, was interfaced to an Input/Output controller hub (ICH) chip via another set of buses. Each of the MCH and ICH further provided interface to various system components and peripherals via further buses and interfaces. Each of these buses and interfaces adhere to well-established standards, enabling the system architectures to support modular designs. To ensure proper design, each of the individual or groups of components could be tested using test interfaces which are accessible through the device pins.

Modularity is also a key aspect of SoC architectures. Typically, the system designer will integrate various functional blocks, including functional blocks that are commonly referred to in the industry as Intellectual Property (IP) cores, IP blocks, or simply IP. For the purposes herein, these functional blocks are referred to as IP blocks or simply "IP"; it will be understood that the terminology IP blocks or IP also covers IP cores and any other component or block generally known as IP, as would be understood by those in the SoC development and manufacturing industries. These IP blocks generally serve one or more dedicated functions and often comprise existing circuit design blocks that are licensed from various vendors or developed in-house. In order to integrate these IP blocks, various interfaces are designed into the SoC. These can be quite challenging, as the well-defined North bridge-South bridge architecture and its standardized interfaces are not practical or desirable for integration in the SoC.

To address this problem, new higher-speed and more modular interfaces have been developed. For example, INTEL Corporation has recently developed new interconnect fabric architectures, including the INTEL On-Chip Scalable Fabric (IOSF). Additionally, other fabric-based interfaces have been developed, including the Open Core Protocol (OCP), and ARM's AMBA (Advanced Microcontroller Bus Architecture) interface. On-chip interconnects such as IOSF interconnect fabrics employ a packetized layered communication protocol and support point-to-point interconnects between IP blocks facilitating easy integration of heterogenous IPs with standard IOSF interfaces.

In order to verify the design integrity of an SoC architecture, testing of the communication between IP blocks and testing of IP functionality and circuitry is required. Under the conventional approach, testing of a given SoC architecture is implemented using Test Access Mechanisms (TAMs) that are devised using ad-hoc techniques. Such TAMs entail dedicated validation and design effort, which needs to be repeated for every lead or derivative SoC. The ad-hoc techniques used also result in extra area and wiring effort at the SoC level, which can cause increased congestion in today's dense SoCs. This can seriously jeopardize Time-To-Market and low-cost goals for SoC. Accordingly, there is a need to facilitate testing of SoC architectures in a manner that is more flexible and predictive.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Embodiments of methods and apparatus for facilitating testing of SoCs are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with aspects of the embodiments disclosed herein, a standard, modular, scalable, and reusable infrastructure for test access, called a Test Access Mechanisms or TAM is provided. The TAM is implemented using existing functional fabric(s) and provides a standard mechanism for delivery of test stimulus and sampling of test response during component debug and manufacturing testing. Reuse of the functional fabric for the TAM reduces the implementation cost, whereby the TAM inherits the benefits of a standardized functional fabric (such as modularity, reusability, scalability, and low cost) over conventional approaches and architectures which entail use of a dedicated test infrastructure that is separate and apart from the functional fabric.

In some of the following embodiments, exemplary implementation aspects and concepts are disclosed that employ a TAM implemented using SoCs that employs an Intel On-Chip Scalable Fabric (IOSF). It will be understood that implementation using an IOSF fabric is merely exemplary, and similar concepts may be employed to implement a TAM using other types of interconnect fabrics, including, but not limited to Open Core Protocol (OCP), and the INTEL Quickpath™ interconnect.

In accordance with one embodiment, the TAM is implemented using fabric infrastructure, protocols, and interfaces that are already implemented on an SoC for delivery of test data and stimulus to and from a tester, also referred to as Automated Test Equipment or ATE. Since the TAM uses the existing functional fabric, it results in less gate count and less global routing (especially important in dense SoCs) than conventional techniques.

The TAM is implemented through two primary components: a Test Controller and a Test Wrapper. As an overview, the Test Controller acts as an agent of the fabric and functions as a portal between the ATE and the SoC, thus enabling an ATE that is external to the SoC to deliver test data to the target IP by converting it into packets employed by the applicable fabric protocol for each type of fabric in the SoC. The packets are de-packetized (if necessary) into test stimulus at the destination IP block by the Test Wrapper. The Test Wrapper then collects the response to the test stimulus from the target IP and transmits it back as one or more packets towards the Test Controller, which then converts it into a form suitable for sampling by the ATE.

Figure 1:
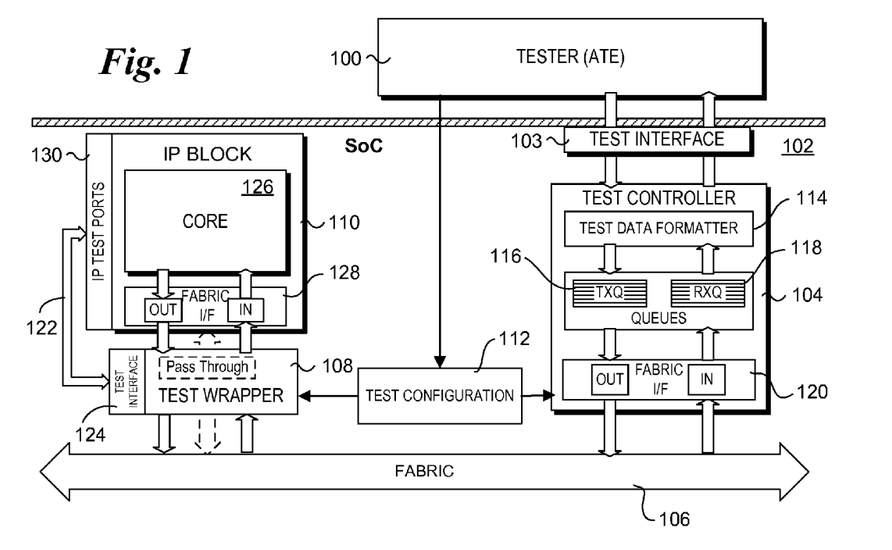
FIG. 1 is a block diagram illustrating an exemplary Test Access Mechanism (TAM) architecture, in accordance with one embodiment of the invention.
Figure 7:
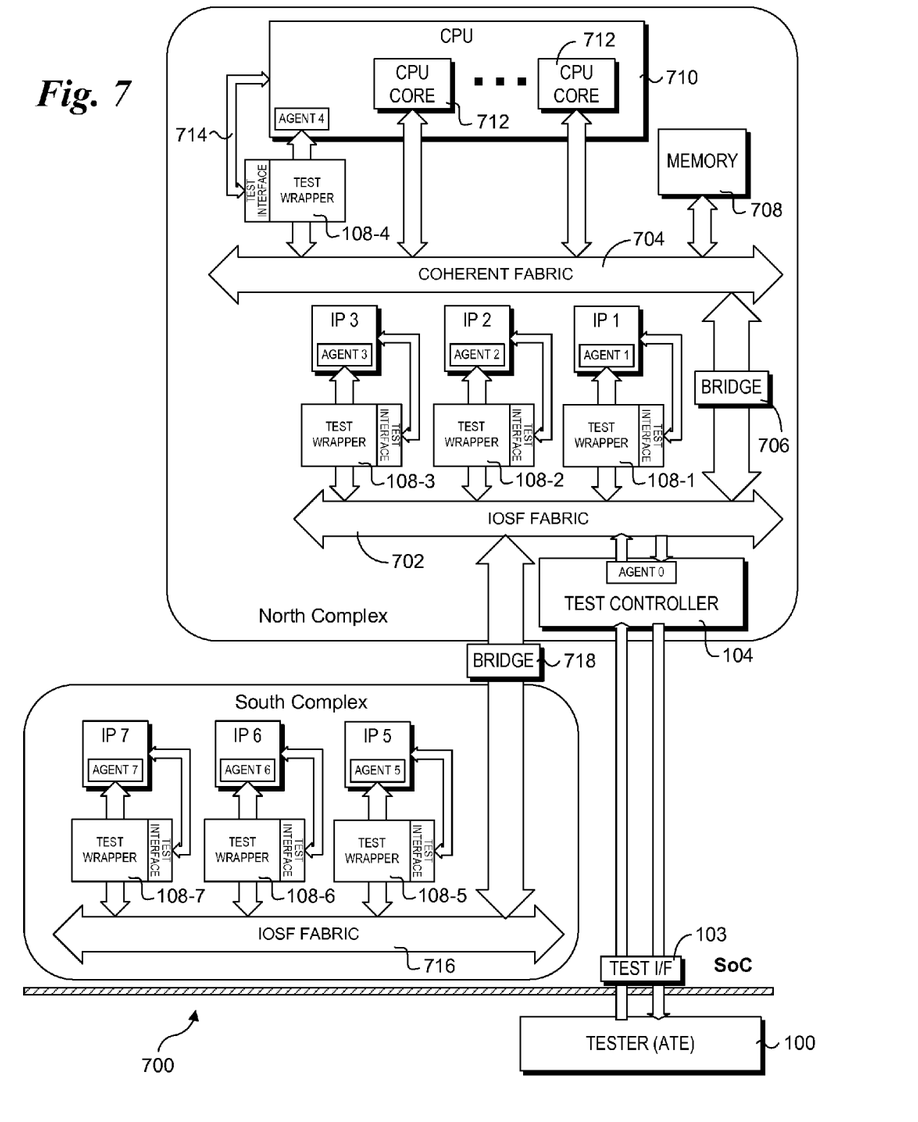
FIG. 7 is a block diagram illustrating an SoC architecture in which a test controller and multiple Test Wrappers are implemented to facilitate testing of corresponding IP blocks.

An exemplary architecture illustrating block-level details of one embodiment of the TAM is shown in FIG. 1. The architecture includes an ATE 100 that is external to an SoC 102 that includes a test interface 103, a Test Controller 104, an interconnect fabric 106, a Test Wrapper 108, an IP block 108, and a test configuration block 112. Each of the test controller 104 and test wrapper 108 are communicatively coupled to fabric 106. Test Controller 104 is also communicatively coupled to ATE 100 via test interface 103, which comprises a plurality of pins on the SoC package. In addition, Test Wrapper 108 is communicatively coupled to IP block 110. Although not shown in FIG. 1 for clarity, various other test wrappers, IP blocks and/or bridges will also be communicatively coupled to fabric 106 in a typical SoC architecture, such as illustrated in FIG. 7 and discussed below.

The Test Controller is the primary interface through which the tester applies test stimulus to the IP-under-Test (IUT) and samples the response from the IUT. The Test Controller provides an abstracted interface between the ATE and the fabric from the tester by providing an interface very similar to the interface needed to test a device that does not employ a fabric-based interface. As shown in FIG. 1, Test Controller 104 includes three main components: a test data formatter 114, a transmit transaction queue (TXQ) 116, a receive transaction queue (RXQ) 118, and a fabric interface 120.

A Test Wrapper acts as the interface between the fabric and the test ports of the IP block: one way of envisioning a wrapper is as an abstraction layer which abstracts out the low-level signaling requirements for testing an IP block from the fabric and conversely abstracts out the fabric-related protocols from the IP block. As shown in FIG. 1, a portion of the test signals from Test Wrapper 108 are interfaced with the fabric interface components of the IP block, while another portion of the test signals connects to the IP test ports 130 via a connection 122 coupled between the IP test ports and a test interface 124 on test wrapper 110. The IP test ports may be used for performing various component and circuit-level tests, including scan tests commonly performed to verify the integrity of IP cores and the like. Test Wrapper 108 is also configured to support pass through of fabric signals directly to IP block 110 to support communication and functional testing of the IP block and fabric interfaces and to support fabric communication operations during normal SoC use.

IP block 110 is illustrative of various types of IP blocks and IP cores that may be tested using a TAM in accordance with the principles and concepts disclosed herein. As illustrated, IP block 110 includes an IP core 126, a fabric interface block 128, and IP test ports 130. Further details corresponding to an exemplary IP block are discussed below with reference to FIG. 6.

Figure 2:
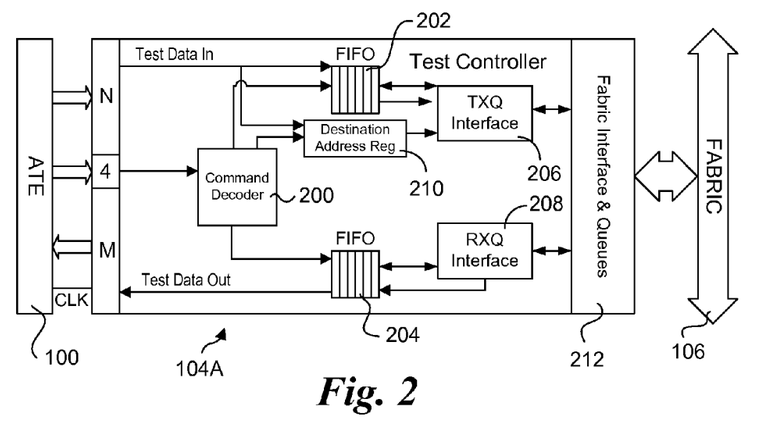
FIG. 2 is a block diagram illustrating a micro architecture of a Test Controller, in accordance with one embodiment.

Details of one embodiment of a micro architecture for Test Controller 104A are shown in FIG. 2. The illustrative components include a command decoder 200, a pair of FIFO (First In, First Out) buffers 202 and 204, respectively coupled to a transmit queue (TXQ) interface 206 and a receive queue (RXQ) interface 208. Test Controller 104 also includes a destination address register 210. In addition, the transmit and receive queues (TXQ 116 and RQX 118) and the fabric interface 120 of Test Controller 104 of FIG. 1 are collectively depicted as a fabric interface block 212 in FIG. 2 for clarity so as to not obscure the other details of the micro architecture for Test Controller 104.

The test data formatter 114 receives tester input comprising test data and tester commands/controls signals from the tester and packages corresponding test data and test commands/instructions for transmission to the IUT: the packaging operation involves including the appropriate address information so that the package is forwarded to the intended destination IP, and appending additional command fields so that the target IP knows what to do with the test data. For instance, in the scan mode, the packet consists of the IP address, and commands embedded in data which direct the Test Wrapper for the IP to execute either a scan load, unload, simultaneous load/unload or pulse the capture clock.

The tester input data packaged by the test data formatter is deposited into the transmit transaction queue for transmission on to the fabric. The maximum package size depends on the size of the transmit/receive transaction queues and is optimized to ensure the overhead for packetization/de-packetization is minimized. To simplify the design of the wrappers by minimizing the amount of bookkeeping, in one embodiment each entry of the transmit transaction queue is a self-contained entity which encodes command as well as the data on which the command is executed. For instance, an entry containing scan data will have fields specifying the type of scan operation (load, unload or both) followed by scan data. Additionally, the destination scan wrapper continues executing scan shift operations as long as it is receiving scan data, leading to a simple, low-cost wrapper design. No bookkeeping is necessary to ensure the scan chain of maximum scan length has been loaded (and the wrapper can be designed independent of the maximum scan chain length). Once a test data packet has been assembled, it is forwarded to the fabric interface for transmission over the fabric as a posted transaction to the destination IUT. Under an alternative scheme, a given test package may be sent using multiple packets; however, this scheme entails more overhead since information in a first packet or other information such as header information would need to be employed to inform the receiver of how many packets were in a particular test package.

In one embodiment, Test Controller 104A operates in the following manner. Test data is received from ATE 100, along with a test command. In the illustrated embodiment, the test data is received from ATE 100 over an N-bit interface, and test commands are received over a 4-bit interface as 4-bit values. However, the use of a 4-bit value is exemplary, as test commands comprising other bit-values may also be employed. In general, each of the N-bit and 4-bit interface may comprise parallel or serial interfaces, although to simplify communications between an ATE and the Test Controller (and by proxy test interface 103 of SoC 102), parallel interfaces are preferred. Moreover, one or more N-bit groups of test data may be employed for a given test package. Additionally, a given test command may be coded as one or more 4-bit test command data values that are received sequentially. The test command data may also comprise control data. In addition to the test data and test command data inputs shown in FIG. 2 there is also a clock (CLK) signal operating at a corresponding clock frequency. As described in further detail below, techniques are implemented by the Test Controller such that the clock frequency used by the ATE clock signal may be different than the clock frequency used by the interconnect fabric.

The test command data from ATE 100 is received at command decoder 200 and decoded using a lookup table, register, or the like. The test command tells the Test Controller what operation is to be performed to control the transfer of data to and from the fabric. The destination address register 210 stores the destination address of the IP towards which a test packet is to be sent, and is loaded using a separate command from the tester. Under the control of applicable test commands, input test data ("Test Data In") is loaded into FIFO 202, and transmit queue interface 204 is used to "load" formatted test command packets into the transmit queue to be transmitted to fabric 106. In practice, transmit queue interface 204 manipulates pointers to identify memory storage locations containing the packet data that is to be transmitted outbound to the fabric.

The fabric interface block 212 provides an interface to communication with fabric 106 using applicable data, signals, and protocols employed by the corresponding interconnect. In some embodiments, fabric 106 comprises a point-to-point interconnect implemented using a plurality of unidirectional serial links of one or more configurable widths, such as 1×, 2×, 4×, 8×, 16×, etc. The fabric may also have a bus-like architecture. In general, any type of existing and future fabric may be employed for implementing the general concepts and principles disclosed herein. Data is transferred using packets and corresponding transactions that are implemented using a multi-level protocol stack employed by fabric 106. For instance, in one embodiment, the fabric protocol corresponds to the Intel On-Chip Scalable Fabric (IOSF) protocol. In other embodiments, fabric 106 may implement the Open Core Protocol (OCP). These examples are not meant to be limiting, as the SoC architecture and corresponding principles and concepts disclosed herein may be implemented with any existing or future interconnect fabric structure and protocol. Moreover, in addition to point-to-point interconnects, the techniques and principles disclosed herein may also be implemented on SoCs employing other topologies such as ring-, mesh-, torus- and bus-based interconnects.

On a more general level, fabric interface block 212 provides a layer of abstraction between the transaction implementation employed by fabric 106 and the data transmitted outbound and received inbound over fabric 106. Accordingly, to support different types of interconnect fabrics, only the circuitry in fabric interface block 212 (and potentially TXQ and RXQ interfaces 206 and 208) would need to be changed, while the rest of the circuitry in Test Controller 104 could remain the same and be implemented in a manner that was independent of the particular fabric interconnect structure and protocols.

In embodiments employing packet-based fabric protocols, test data and corresponding test command information is "packetized" (that is, formatted in one or more packets) and transferred over the fabric to a target IP block, as identified by a corresponding address assigned to the IP block. Likewise, test output data generated by the target IP block and/or Test Wrapper (as described below in further detail) is received at fabric interface block 212, "de-packetized," and loaded into FIFO 204 in accordance with applicable test commands, with coordination of the receive queue transfer being facilitated by RXQ interface 206 via corresponding control signals. Applicable test result data buffered in FIFO 204 is then transferred out of Test Controller 104 to be received as "Test Data Out" (i.e., test response data) by ATE 100. As depicted in FIG. 2, the test data is received from Test Controller 200 as one or more M-bit data blocks. As before, an M-bit data transfer may be implemented via a parallel or serial interface, and a given test result may comprise one or more M-bit units of data.

As an overview, there are two classes of testing that is performed on a typical IP block: functional testing and structural testing. Functional testing relates to testing the communication interfaces and the functionality performed by the IP block, and since each IP block that is communicatively or operatively coupled to a fabric in an SoC can send and receive data via the fabric, functional testing can generally be facilitated through use of test data and commands sent via the fabric. Accordingly, in one embodiment the Test Wrapper provides a pass through mechanism to enable test packets containing testing data and commands relating to functional testing to be passed from the Test Controller via the fabric and for packets containing test results and/or functional test return data back through the Test Wrapper to be returned to the Test Controller.

In addition to functional testing, structural testing is also supported by the Test Wrapper. In essence, the Test Wrapper in combination with the Test Controller provide a mechanism that effectively couples an ATE to the test ports in each IP block for which a Test Wrapper is implemented. Accordingly, structural testing that might be performed on a conventional discrete component, such as scan testing can likewise be performed on an IP block; however, under the architecture disclosed herein there is no need for global wiring from an ATE SoC interface or switch block to each IP block, or the need for global wiring to separate JTAG pins, saving valuable die layout space. In addition, since the Test Wrapper design is modular, reusable, and involves very little die space, it is easy to add to new and existing designs with minimum impact on development timelines and thus time-to-market concerns are alleviated. Moreover, the modular and reusable nature of the architecture means that separate customized test architectures are no longer required.

As discussed above, a Test Wrapper acts as the interface between the fabric and the test ports of the IP. The Test Wrapper retrieves test packets that originate at the Test Controller via the fabric, interprets how the data in the packets needs to be processed through commands embedded in the packets themselves, and then applies the data with the proper signaling protocols to the appropriate test ports of the IP. For example, in the scan mode (asserted by setting the appropriate control registers through the TAP), the wrapper performs scan load operations using the scan data supplied by the test controller (retrieved from the packets deposited in the IP receive queue (RXQ)), stores the scan unload data (response) from the IP into the IP transmit queues (TXQs), and applies the appropriate capture clocks when directed by the commands embedded in the scan packets. A Test Wrapper for a particular test methodology can be implemented by designing sub-blocks which perform the following functions:

RXQ/TXQ Read-Write Logic:

This is a sub-block that interfaces with the transactions queues to retrieve data from the receive queue (RXQ) and places data in the transmit queues (TXQ) for eventual forwarding back to the Test Controller via the fabric. Data is retrieved from RXQ by detecting that new data has arrived in the RXQ. Arrival of data in RXQ could be determined by a simple status signal or by comparing the head and tail pointers of the queue (if present). A read operation from RXQ is usually performed by popping the entry from the RXQ. Similarly a write operation on the TXQ is performed when response data is available from the IP and it is determined that the TXQ has adequate space to support the write operation (either using a simple status signal, or by comparing the head and tail pointers of the TXQ). Once the number of TXQ entries reaches a predetermined limit, the data in the TXQ is forwarded to the Test Controller as a fabric packet.

Test Protocol Translator:

This is a logical sub-block (implemented via multiple components) that interfaces with the RXQ/TXQ Read-Write Logic described above on one side and interfaces with the test pins of the IP on the other side to implement the test protocol needed to test the IP. This interfacing involves decoding embedded commands and converting raw data from the RXQ to waveforms needed to apply test stimulus to the IP, and sampling the response waveforms from the IP and converting them to data suitable for writing into TXQ. By careful design, Test Protocol Translators needed to implement diverse structural test methodologies test methodologies such as scan can share the same RXQ/TXQ Read-Write Logic to lower the hardware overhead for the Test Wrapper.

Clock-Domain Crossings:

The main sub-block that has to deal with as many as 3 different clock domains is the RXQ/TXQ Read-Write Logic: it has to contend with the reference clocks needed to read and write to/from RXQ/TXQ and the reference clocks used by the Test Protocol Translator, which are determined by the signaling requirements of the test protocol (for instance, a scan wrapper would use a reference clock determined by the maximum shift frequency). To ensure an orderly exchange of data across these clock boundaries, handshaking logic is used to ensure data is not sampled before it is available, and enough time is allowed to send data to logic which may be on a different clock domain. Figures of example clock-domain crossing implementations for a Test Controller and Test Wrapper are respectively shown in FIGS. 4 and 5, discussed in further detail below.

An important point to note here is that the Test Wrapper is only needed for structural or other non-functional test applications. In such cases the functional transactions need to be modified by the Test Wrapper to fit a non-functional/structural protocol. For functional tests the IP will be responding directly to the functional transactions coming in from the fabric and hence the Test Wrapper is not needed. Accordingly, the pass through feature of the Test Wrapper is implemented during functional testing.

Figure 3:
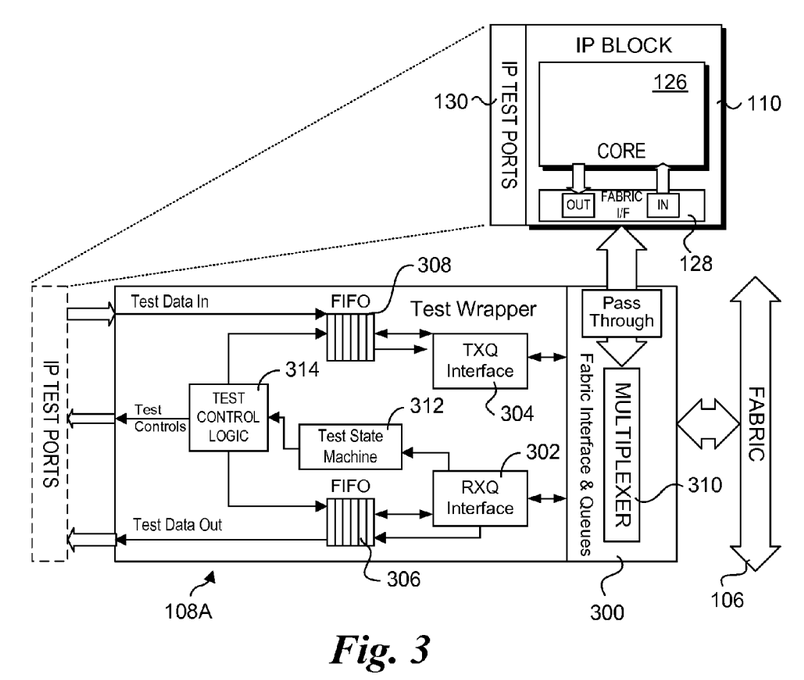
FIG. 3 is a block diagram illustrating a micro architecture of a Test Wrapper, in accordance with one embodiment.

FIG. 3 shows further details of one embodiment of a micro architecture for a Test Wrapper 108A and interfaces to and from a generalized IP block 110. Several of the components shown in FIG. 3 are similar to analogous components in Test Controller 104A of FIG. 2, including a fabric interface 300, RXQ and TXQ interfaces 302 and 304, and FIFOs 306 and 308. Test Wrapper 108 further includes a multiplexer block 310, a test state machine 312, and test control logic 314.

Fabric interface block 300 employs multiplexer circuitry and associated logic, collectively depicted as multiplexer block 310, to facilitate both send/receipt and pass through of signals received inbound from and sent outbound to fabric 106. From the perspective of the interconnect fabric, each IP block that interfaces to the fabric has a respective fabric interface and unique interconnect address. In some embodiments (depending on the particular fabric architecture and protocol), each device or IP block that interfaces to a fabric employs an agent for handling transaction packets sent via the fabric interconnect. As used herein, such agents (which may generally be implemented via programmed logic and the like) are embedded within the fabric interface blocks depicted in the Figures and are not separately shown for clarity purposes; however, it will be understood that such agents and their associated functionality are implemented in the various fabric interface blocks for applications that employ interconnect fabric protocols employing such agents.

In the illustrated embodiment, test packets that originate at a Test Controller for use for testing a given target IP block may have one of two addresses: an address corresponding to the IP block itself (generally for functional testing); or an address allocated to the Test Wrapper. As discussed above, since functional testing of the IP block does not require support from the Test Wrapper, the Test Wrapper can be bypassed. This is effected by the multiplexer block 300, as discussed above. To determine the correct target of the test packets (IP block, or Test wrapper), some type of address detection for each packet is performed. Thus, fabric interface block 300 or the fabric (106) includes circuitry to detect the packet address and then route the packet accordingly.

Transmission of outbound packets from a Test Wrapper and associated IP block are handled in a somewhat similar manner, only in reverse. In this case, signals from IP block fabric interface 128 and signals generated internally by Test Wrapper 108 are selectively coupled to the fabric interface of the Test Wrapper via multiplexers. In this case, there is no need for address detection, as mere presence of outbound data on the interconnect signal path between fabric interface 128 and the Test Wrapper indicates the source of the output packet is IP block 110. From the perspective of an IP block, the Test Wrapper is transparent, as if the fabric interface of the IP block was connected directly to the interconnect fabric. This desired functionality is facilitated by this designed-in signal pass through functionality.

Data packets destined for the Test Wrapper are retrieved from the transaction retrieve queue in fabric interface block 300 using RXQ interface 302, which in turn drives a test state machine 306 that provides corresponding inputs into test control logic 314, which interprets the inputs and applies corresponding test stimulus to the IP block via Test Controls signals and associated test data (as depicted by "Test Data Out"). Similarly, response data ("Test Data In") is retrieved from the IP block, buffered in FIFO 308, formatted into packets and transferred over fabric 106 via use of TXQ interface 304 and fabric interface block 300. The destination of the test response packets is usually the Test Controller, which de-packetizes and reformats the response data and transfers the data to the ATE. Depending on the test method being implemented by the Test Wrapper, corresponding circuitry and logic is implemented via test state machine 312 and test control logic 314, and appropriate test data is transferred through the "Test Data Out" and "Test Data In" signals. For instance, if the wrapper is designed to apply scan data, the "Test Controls" are scan control signals (scan enables, capture and scan clocks), and the "Test Data In" and "Test Data Out" signals interface with the scan data in and scan data out signals of the IP (via corresponding IP test ports 130). For a wrapper implementing multiple test methodologies for an IP, some of the building blocks can be shared (such as blocks that communicate with the fabric, e.g., the FIFOs and the RXQ and TXQ interfaces).

Figure 4:
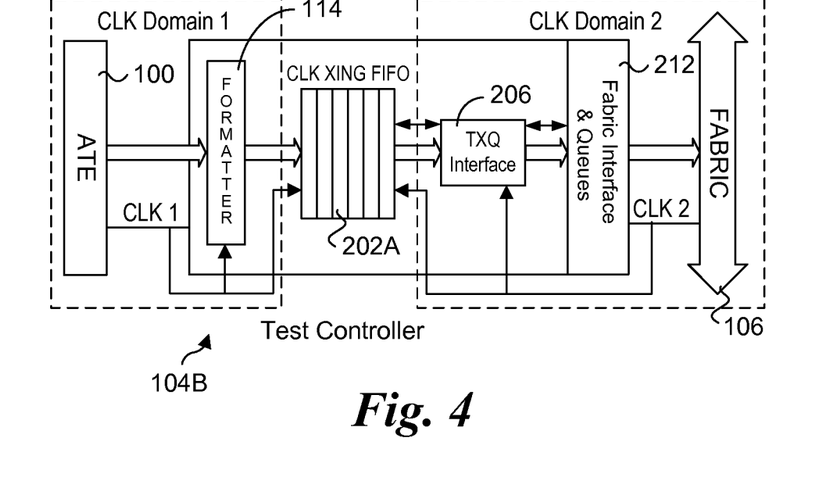
FIG. 4 is a block diagram illustrating use of a clock crossing FIFO in a Test Controller; in accordance with one embodiment.

As describe above, in one embodiment the FIFOs comprise timing crossing FIFOs that are configured to facilitate a difference in clock frequencies employed by the communication signals between an ATE and the Test Controller, and between the Test Controller and the fabric. For example, this is schematically illustrated in FIG. 4. In general, if the ATE and fabric(s) run off separate and unrelated clocks, the clock-crossing FIFOs synchronize data: usually the tester will have to run at 2× or more slower than the fabric clock to ensure data integrity. In another scenario, if Design for Test (DFT) logic is inserted (simple bypass MUXes) to make the tester clock the same as the fabric clock, then the synchronizing FIFOs are not needed, and the tester can run as fast as the fabric. The latter scenario is the preferred choice of implementation for structural tests.

In the example shown in FIG. 4, ATE 100 and the components on the left-hand side of Test Controller 104B (collectively shown as Formatter 114) operate at a first clock frequency CLK 1 corresponding to a first clock domain (CLK Domain 1). Meanwhile, the components on the right-hand side of Test Controller 104, collectively represented by TXQ interface 206 and fabric interface block 212 for simplicity, operate in a second clock domain (CLK Domain 2) corresponding to the frequency of a CLK 2 signal employed by fabric 106. The clock crossing FIFO 202A is configured to cross the different clock domains, operating in an asynchronous manner relative to one or both of the clock signal frequencies and employing applicable handshaking circuitry to ensure data integrity. The circuitry and logic is simplified if the frequency of CLK 2 is a multiple of the frequency of CLK 1, but this is not a strict requirement. Although not shown, the circuitry of Test Controller 104B relating to receipt and processing of test result packets is configured in a similar manner, wherein FIFO 204 is configured as a second clock crossing FIFO.

A similar technique is employed for addressing clock frequency differences between the interconnect fabric, Test Wrapper, and IP block. As shown in a Test Wrapper 108B of FIG. 5, the components (abstracted here for simplicity) are divided into two clock domains, labeled CLK Domain 2 and CLK Domain 3. The clock domains are crossed using handshaking control and timing circuitry implemented in a clock crossing FIFO 306A. In a similar manner, circuitry relating to packaging and forwarding of test result data in the Test Wrapper would be implemented, including a clock crossing FIFO 308 (not shown).

In general, substantially any test that might be performed on a discrete component using a tester coupled directly to pins on the discrete component may be performed on an IP block having similar core circuitry using the combination of the Test Controller and Test Wrapper disclosed herein. Specific test logic may be embedded in one or more of the components herein, depending on the particular test requirements. Typically, test logic particular to a type of class of IP block or core may be embedded in the Test Wrapper implemented for that class.

Figure 6:
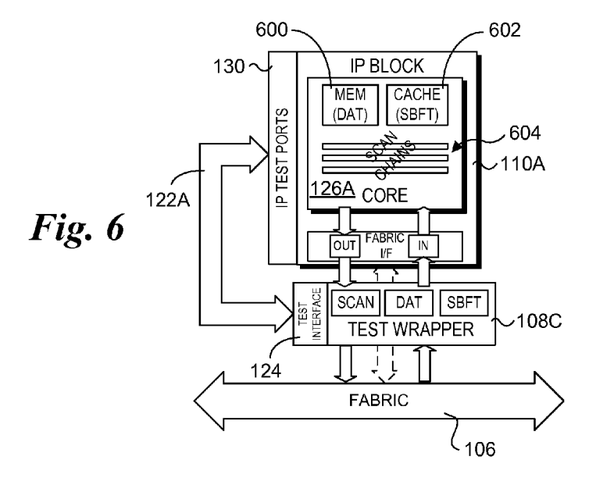
FIG. 6 is a block diagram illustrating details of an exemplary IP block and corresponding test logic.

For example, an exemplary IP block 110A shown in FIG. 6 is illustrative of a class of IP block for which scan testing is applicable. As depicted, IP block 110A has an core 126A including memory 600, cache 602, and scan chains 604. Also depicted is logic in a Test Wrapper 108C for performing scan testing, Direct Access Test (DAT) testing, and Structure Based Function Test (SBFT).

As discussed above, the Test Wrapper provides a test interface to communicate with the IP test ports of the IP block. This interface is schematically depicted as a Test Interface block 124 and a connection 122A. In general, connection 122A may be implemented via any type of connection capable of transmitting data and/or signals, such as a bus, serial connection, etc.

Another aspect relating to the implementation of the TAMs disclosed herein is TAM configuration. Before test data is delivered to the TAM, the TAM has to be configured so that various components of the TAM know how to process the data. For instance, in the scan mode, the wrappers and test controllers need to be configured so that they can package and interpret the scan data correctly, and interpret the appropriate fields in the scan-oriented packets to do shift operations, apply capture clocks etc. Such configuration is better done using an independent mechanism such as the 1149.1 TAP, IEEE 1500 WTAP or a fabric sideband. At a minimum, the configuration mechanism is expected to support all of the test modes supported by the TAM, such as scan, DAT and SBFT. To simplify design, validation and bring-up, the configuration mechanism should not be dependent on an operational fabric, and it is assumed the independent configuration mechanism will place the TAM in the appropriate test mode before the first test-related operation is initiated over the fabric.

Generally, logic for implementing the TAM test configuration may be embedded in the Test Controller, implemented in a separate block, or may comprise logic distributed among multiple components. For example, logic for implementing test configuration is depicted as test configuration block 112 in FIG. 1. In this exemplary implementation, test configuration block 112 receives input and control information from ATE 100, and, in response, provides test configuration data to each of Test Controller 104 and Test Wrapper 108.

As discussed above, aspects of the embodiments disclosed herein may be implemented using various types of interconnect fabrics and associated fabric protocols, and the overall Test Controller and Test Wrapper architecture is independent of any particular interconnect fabric. However, to better illustrate interface aspects related to the use of an interconnect fabric for facilitating related communication operations, embodiments are now presented using an IOSF interconnect fabric.

IOSF is an on-die functional interconnect fabric that is being proliferated across INTEL SoCs. IOSF offers a plug-and-play mechanism of integrating IOSF-compliant IPs into an SoC, and is based on the PCI-e standard. IOSF enforces standardization at the interface and protocol level, but does not specify the fabric implementation to allow flexibility in how the fabric is implemented to address different SoC market segments. Being based on PCI-e allows compatibility of shrink-wrap operating systems that assume PCI-e behavior. A primary motivation for developing the technology disclosed herein was to enable usage of the IOSF standard functional interconnect fabric as a standard TAM for the purpose of delivering data to and sampling response from IOSF fabric-resident IPs. This allows for a logical layering of a standardized TAM with plug-and-play capabilities over a standard functional interconnect, reducing design overhead.

Figure 1A:
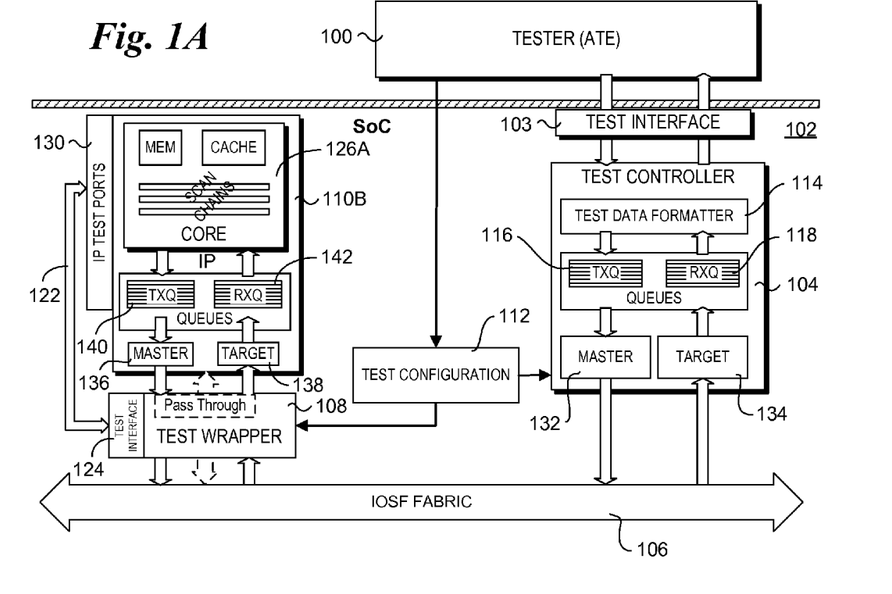
FIG. 1A is a block diagram of an embodiment of the TAM architecture of FIG. 1 implementing an IOSF fabric.

FIG. 1A shows an embodiment of the TAM architecture of FIG. 1 implementing an IOSF interconnect Fabric. Many of the illustrated components in FIG. 1A share the same reference numbers as analogous components in FIG. 1, and such components perform similar operations in both embodiments. Additionally, the architecture in FIG. 1A includes an IP block 110B that includes the IP core 126A of FIG. 6, wherein the operations of the components of IP core 126A in FIGS. 6 and 1A are similar.

Under IOSF, communication over the interconnect fabric is facilitated through use of packets that are delivered via the interconnect using a multi-layer protocol. The protocol employs agents at each endpoint that manage communication and arbitration operations for the transfer of packet data over the interconnect. The protocol also employs a master and target interfaces that respectively facilitate send and receive fabric interface operations. Under the IOSF protocol, packet transmissions originate at a master interface an include address information corresponding to a target interface on a targeted (for receipt of the packets) IP. The master and target interfaces in FIG. 1A include a master interface 132 and target interface 134 in a test controller 104C, and a master interface 138 in IP block 110B. IP block 110B further depicts a transmit transaction queue (TXQ) 140 and a receive transaction queue (RQX) queue 142. The pairing of a TXQ to a master interface and the pairing of a target interface to an RXQ are common to each IOSF interface. Although not shown in FIG. 1A, Test Wrapper 108A also includes master and target interfaces and an associated TXQ and RXQ.

In general, an actual TAM implementation for an SoC will include a Test Controller that communicates with multiple Test Wrappers, with an instance of a Test Wrapper for each IP for which the TAM architecture is implemented for testing that IP. The particular micro architecture of a given Test Wrapper will be somewhat dependent on the IP it is designed to test, although many of the micro architecture sub-blocks described herein will be reusable across Test Wrappers. An exemplary implementation of such a TAM architecture is illustrated by an SoC 700 shown in FIG. 7.

SoC 700 includes a Test controller 104 coupled to a test interface 103 configured to be connected to ATE 100 via a plurality of SoC test pins. The components of SoC 700 are depicted as being divided between a north complex and a south complex, which is somewhat analogous to the discreet component integration employed by INTEL's north bridge/south bridge architecture, acknowledging that in an SoC all of the components are integrated on a common die without external interconnects between components.

The North complex includes a plurality of IP's (depicted as an IP 1, IP 2, and IP 3) connected to an IOSF fabric 702. Each IP includes a respect agent (depicted as Agent 1, Agent 2, and Agent 3) that is used to facilitate communication between the IP and other agents coupled to the IOSF fabric, including an Agent 0 implemented by test controller 104. Respective Test Wrapper 108-1, 108-2, and 108-3 are implemented to facilitate testing of IP 1, IP 2, and IP 3, and are also coupled to IOSF fabric 702.

The North complex also includes a coherent fabric 704 communicatively coupled to IOSF fabric 702 via a coherent-to-IO fabric bridge 706. Coherent fabric 704 supports coherent memory transactions for accessing various shared memory resources, which are collectively depicted as memory 708. A CPU 710 including a plurality of cores 712 is communicatively coupled to coherent fabric 704, wherein each core is enabled to access memory 708 while maintaining memory coherency. Support for maintaining memory coherency using a coherent interconnect fabric is typically maintained by various agents (not shown for clarity).

A Test Wrapper 108-4 is implemented for facilitating testing of CPU 710, and interfaces with CPU 710 via an interface 714 and an agent (Agent 4) on the CPU. Agent 4 and the fabric interface components of Test Wrapper 108-4 are configured to interface with coherent fabric 704, which employs a different interface structure and protocol than IOSF fabric 702. Bridge 706 facilitates a bridging operation between the two fabric protocols, converting packets in accordance with a first protocol (e.g., IOSF) into packets corresponding to a second protocol (e.g., OCP), while also facilitating timing and signaling interfaces between the two fabrics. In this manner, test package data can be sent from Test Controller 104 via IOSF fabric 702, bridge 706, and coherent fabric 704 to Test Wrapper 108-4, and corresponding test result data can be returned in the reverse direction back to the test controller.

The implementation of the Test Wrappers in the South complex is similar to the implementation of Test Wrappers coupled to IOSF fabric 702 in the North Complex. The South complex includes an IOSF fabric 716 to which multiple IPs are communicatively coupled, as depicted by an IP 5, and IP 6, and an IP 7, which communication with the fabric facilitated by respect Agents 5, 6, and 7. Testing operations for each of these IPs is facilitated by a respect Test Wrapper 108-5, 108-6 and 108-7. IOSF fabric 716 is shown coupled to IOSF fabric 702 via an IOSF-to-IOSF bridge 718. In an alternative configuration, IOSF fabrics 702 and 716 comprise a single interconnect fabric; accordingly, no bridge would be employed. In another embodiment, the South Complex fabric comprises an OCP fabric, and bridge 718 comprises an IOSF-to-OCP bridge.

Structural test applications like scan provide another opportunity to optimize the hardware overhead due to the Test Wrapper. In one embodiment, multiples IPs may be grouped into a "test partition" with their scan chains daisy-chained together to form a combined IUT. Other schemes may also be employed, such as a STAR configuration of a combination of STAR and daisy-chains. Such a test partition architecture requires only one Test Wrapper for the entire partition instead of one Test Wrapper for each IP. This further reduces the hardware overhead. The test partition methodology is driven by several factors, such as the size of an IP, physical proximity of the various IPs, overall power dissipation during test, etc. For example, an individual IP may be too small to be scan tested by itself, making it suitable for inclusion into a test partition with other IPs.

Figure 8:
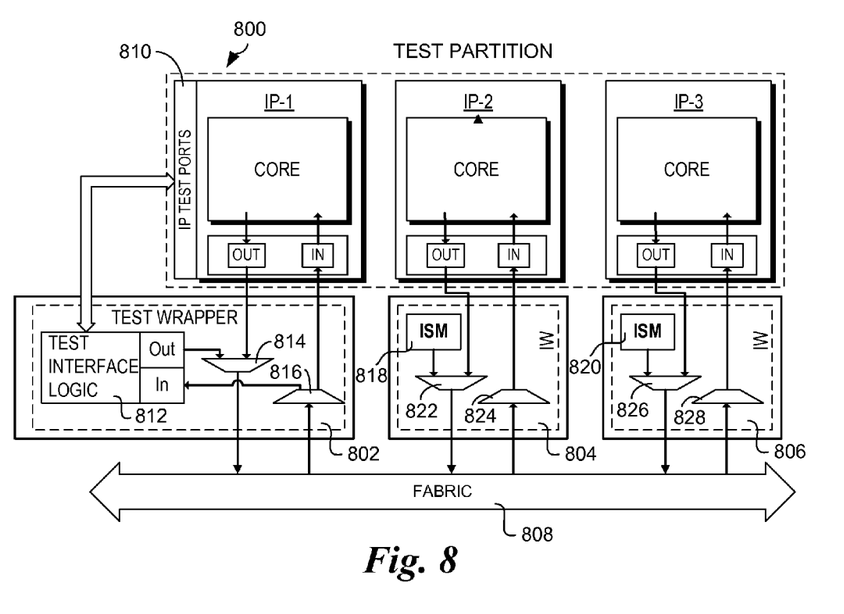
FIG. 8 is a block diagram illustrating an embodiment of a test wrapper that is configured to test multiple IP blocks comprising a test partition.

An exemplary implementation of a test partition using an embodiment of the Test Wrapper is shown in FIG. 8. In this instance, IP blocks IP-1, IP-2, and IP-3 are grouped to form a test partition 800. The architecture further includes Test Wrappers 802, 804, and 806, which are respectively coupled to IP blocks IP-1, IP-2, and IP-3 on one side and to a fabric 808 on the other side. Under this example configuration, the bulk of the test wrapper logic is implemented in Test Wrapper 802, with the logic implemented in Isolation Wrappers (IW) 804 and 806 primarily used to keep IP blocks IP-2 and IP-3 in a quiescent, non-interfering state during test. In a similar manner, the bulk of the test logic implemented for the IP blocks in the test partition is implemented in a "host" IP block, which in this example is IP block IP-1. In general, the host IP block will have interface logic depicted as IP test ports 810 to facilitate the particular tests to be implemented. For example, a typical test would be a scan test, and thus test partition 800 would operate as a scan partition.

Figure 5:
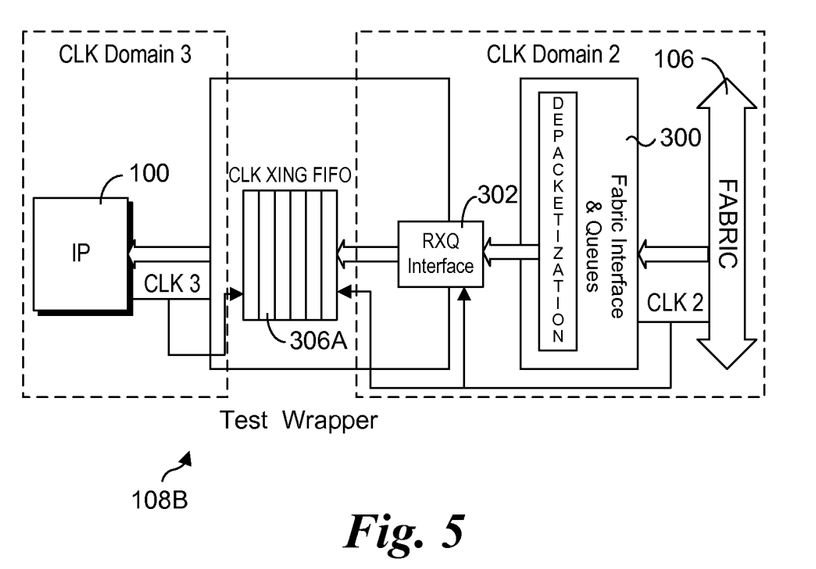
FIG. 5 is a block diagram illustrating use of a clock crossing FIFO in a Test Wrapper, in accordance with one embodiment

In general, Test Wrapper 802 would be configured in a manner similar to 108 discussed above including detailed embodiments depicted as 108A and 108B in FIGS. 3 and 5. For convenience, the corresponding logic is depicted as test interface logic 812 in FIG. 8. As before, Test Wrapper 802 includes logic to facilitate the routing of test input and output signals via appropriate fabric interfaces, as depicted by multiplexers 814 and 816. The particular type of fabric interfaces will depend on the corresponding fabric architecture and protocols implemented by fabric 808, which represents any type of existing or future fabric architecture. In general, the overall test wrapper and associated test partition scheme is agnostic to the particular fabric that is implemented.

As discussed above, Test Wrapper 802 handles the bulk of the testing operations, including the interface to the host IP block IP-1. Meanwhile, Isolation Wrappers 804 and 806 are kept in an isolation mode such that testing on IP blocks IP-2 and IP-3 can be carried out without interference from communications to and from fabric 808. In one embodiment, this is implemented via respective idle state machines (ISM) 818 and 820, which are operatively coupled to multiplexers 822, 824, 826, and 828, as depicted in FIG. 8. Generally, the ISM's are finite state machines that ensure the fabric get proper handshaking signals for the Isolation Wrappers 804 and 806 during testing. In a manner similar to that described above for Test Wrapper 108, the Isolation Wrappers can be configured to operate as fabric signal pass throughs, which would be the configuration employed outside of testing operations. When operating in a pass-through mode, the handshaking signals are facilitated by the fabric interface block for each IP block.

The host IP block in a test partition is employed to implement testing of the other IP blocks in the partition (in conjunction with test stimulus from test interface logic 812) and to facilitate communication of the test result data corresponding to the IP blocks in the test partition back to Test Wrapper 802, which, in turn, will forward the results back to the Test Controller (not shown) in a manner similar to that described above for the TAM architectures of FIGS. 1 and 1A. For example, the results of scan tests performed on IP Blocks IP-1, IP-2, and IP-3 would be returned to Test Wrapper 802, packetized, and forwarded back to the Test Controller via fabric 808.

In the foregoing embodiment, a single host IP block was used to facilitate testing of multiple IP blocks in a test partition. However, this is not meant to be limiting, as a Test Wrapper could be configured to provide test input to multiple IP blocks in a test partition using an alternative configuration. For example, each of the multiple IP blocks could include its own set of IP test ports and receive test input from and communicate results back to a test wrapper, or a hybrid scheme could be used that employs a host IP block for some operations and sideband communication between the test wrapper and one or more other IP blocks.

It should also be noted that for scan architectures using compression/decompression, the Test Wrapper may be configured to interface to the compression/decompression logic. Under such a configuration the Test Wrapper will feed the decompression block and will get scan response data back from the compression block. This scheme offers two advantages. First, the Test Wrapper is shielded from changes made to the internal number of scan chains. Based on high-volume manufacturing requirements for the product the internal number of scan chains for an IP could be modified without impacting the Test Wrapper. Second, the number of external scan chains of an IP (i.e., the number of scan chains seen by the Test Wrapper) could be standardized to a number equal to or less than the width of the fabric such that one shift cycle of scan data could be transported over the fabric in one data cycle. This simplifies the designs of both the Test Controller and Test Wrapper to a great extent, further reducing the hardware overhead.

The combined use of the Test Controller and a Test Wrapper provides a mechanism for effectively transmitting test commands, test stimulus, and test results to and from an IUT such that the ATE is effectively coupled to each IP without the need for global wiring. Moreover, the TAM architecture supports reuse and scalability, while minimizing the need for generating and implementing specific test facilities requiring corresponding circuitry for each SoC design or derivative. For example, once a test wrapper for a given IP block has been designed, that test wrapper design can be used wherever an instance of the IP block is implemented in an SoC employing similar communication architectures (e.g., the same interconnect fabric). Moreover, it is envisioned that the Test Controller may be configured to support testing across multiple SoC architectures and/or derivatives. For example, a "universal" test controller could be configured to support testing across a chipset family. Optionally, a configurable RTL block for the test controller that contains parameterizable sub-components (such as type and number of signals) and also sub-components which can be included/excluded using compiler directives could be employed. As another option, a program or script that functions as a "Test Controller Generator" could be used to generate a customized test controller on-the-fly using pre-coded building blocks and templates.

The exemplary embodiments of the invention disclosed herein illustrate implementation of various aspects of the invention as implemented on a semiconductor chip, as exemplified by an SoC architecture. In addition, embodiments of the present description may be implemented within machine-readable media. For example, the designs described above may be stored upon and/or embedded within machine readable media associated with a design tool used for designing semiconductor devices. Examples include a netlist formatted in the VHSIC Hardware Description Language (VHDL) language or Verilog language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A system on a chip (SoC), comprising:
an interconnect fabric over which data is transferred using a packetized multi-layer protocol;
an intellectual property (IP) block, operatively coupled to the interconnect fabric; and
a test wrapper, communicatively coupled to each of the interconnect fabric and the IP block;
wherein, in response to receiving a test package comprising test data and/or test commands sent via one or more packets transferred over the interconnect fabric, the test wrapper is configured to provide corresponding test input data, control and/or stimulus signals to the IP block to perform one or more test operations on circuitry in the IP block.

2. The SoC of claim 1, wherein the interconnect fabric comprises an Intel On-Chip System Fabric.

3. The SoC of claim 1, wherein the IP block includes a fabric interface and the test wrapper is configured to enable pass through of interconnect fabric signals to the fabric interface of the IP block to enable the IP block to be communicatively coupled to the interconnect fabric.

4. The SoC of claim 1, wherein the test wrapper includes fabric interface circuitry configured to interface to an interconnect fabric operating at a first clock frequency and the test wrapper is configured to interface with an IP test port of the IP block using signals operating at a second clock frequency.

5. The SoC of claim 1, wherein the test wrapper is configured to receive test result data from the IP block interface and to packetize the test result data into one or more packets and send the one or more packets via the interconnect fabric to a test component employed to facilitate testing of the SoC.

6. The SoC of claim 1, further comprising:
a plurality of IP blocks operatively coupled to the interconnect fabric; and
a plurality of test wrappers, each test wrapper communicatively coupled to the interconnect fabric and a respective IP block;
wherein each of the test wrappers is configured to receive test packages via the interconnect fabric and provide corresponding test input data, control and/or stimulus signals to its respective IP block to perform one or more test operations defined by the test packages on circuitry in the IP block.

7. The SoC of claim 1, wherein the test wrapper is configured to perform scan testing on the IP block.

8. A system on a chip (SoC), comprising:
an interconnect fabric over which data is transferred using a packetized multi-layer protocol;
a plurality of intellectual property (IP) blocks comprising a test partition, operatively coupled to the interconnect fabric; and
a test wrapper; communicatively coupled to each of the interconnect fabric and at least one of the plurality of IP blocks;
wherein, in response to receiving a test package comprising test data and test commands sent via one or more packets transferred over the interconnect fabric, the test wrapper is configured to provide corresponding test input data, control and/or stimulus signals to the at least one IP block to which the test wrapper is communicatively coupled to perform one or more test operations on circuitry in each of the plurality of IP blocks.

9. The SoC of claim 8, further comprising at least one isolation wrapper, each isolation wrapper communicatively coupled to the interconnect fabric and a respective IP block, wherein the isolation wrapper is configured to isolate the respective IP block from the interconnect fabric during at least one test operation performed on the IP block.

10. The SoC of claim 9, wherein the test wrapper and the at least one isolation wrapper are configurable to facilitate pass through of signals between the plurality of IP blocks and the interconnect fabric.

11. The SoC of claim 10, wherein the test wrapper is communicatively coupled to a single IP block comprising a host IP block, and the host IP block is configured to provide test input signals to the other IP blocks in the test partition and return test result data corresponding to testing performed on the other IP blocks and the host IP block to the test wrapper.

12. The SoC of claim 10, wherein the test wrapper is configured to receive test result data corresponding to testing performed on the plurality of IP blocks and packetize the test result data into one or more packets and send the one or more packets via the interconnect fabric to a test component employed to facilitate testing of the SoC.

13. A method, comprising:
testing a plurality of IP blocks comprising a test partition in a system on a chip (SoC) by,
transmitting, via an interconnect fabric over which data is transferred using a packetized multi-layer protocol, one or more packets containing test data and/or test commands to a test wrapper integrated on the SoC and communicatively coupled to at least one of the IP blocks and the interconnect fabric; and
providing, via the test wrapper, test input data, control, and/or stimulus signals to the at least one IP block in the test partition to facilitate circuit-level testing of the plurality of IP blocks corresponding to the test data and/or test commands.

14. The method of claim 13, further comprising:
receiving, at a test controller integrated on the SoC, tester input from a tester external to the SoC;
generating, at the test controller and based on the tester input, a test package including the test data and/or test commands; and
transmitting the test package from the test controller to the test wrapper via the interconnect fabric as one or more packets.

15. The method of claim 14, further comprising:
receiving test result data corresponding to circuit testing of the plurality of IP blocks at the test wrapper; and
transmitting one or more packets comprising the test result data from the test wrapper via the interconnect fabric to the test controller, the test result data comprising circuit testing performed on the IP block.

16. The method of claim 13, further comprising isolating at least one of the plurality of IP blocks from the interconnect fabric during circuit testing of the at least one of the plurality of IP blocks.

17. The method of claim 16, further comprising:
employing at least one isolation wrapper to isolate the at least one of the plurality of IP blocks from the interconnect fabric during the circuit testing; and
configuring the at least one isolation wrapper after completion of the circuit testing to facilitate pass through of signals between that at least one of the plurality of IP blocks and the interconnect fabric.

18. The method of claim 13, wherein the test wrapper is communicatively coupled between one of the plurality of IP blocks and the interconnect fabric, the method further comprising configuring the test wrapper to pass through signals from the IP block to the interconnect fabric.

19. The method of claim 13, wherein the test wrapper is communicatively coupled to one of the IP blocks comprising a host IP block, the method further comprising:
   providing test input from the test wrapper to the host IP block; and
   employing the host IP block to provide at least one of test data or test stimulus to at least one other IP block in the test partition to facilitate circuit testing of the at least one other IP block.

20. The method of claim 19, further comprising:
   collecting test result data from the at least one other IP block at the host IP block; and
   sending the test result data from the host IP block to the test wrapper.

21. The SoC of claim 1, wherein the interconnect fabric comprises a plurality of point-to-point multi-lane serial links.

22. The SoC of claim 1, wherein the interconnect fabric comprises one of a ring-, mesh-, torus- and bus-based interconnect topology.

23. The SoC of claim 8, wherein the interconnect fabric comprises a plurality of point-to-point multi-lane serial links.

24. The SoC of claim 8, wherein the interconnect fabric comprises one of a ring-, mesh-, torus- and bus-based interconnect topology.

* * * * *